(12) United States Patent
Bourrières et al.

(10) Patent No.: US 7,455,209 B2
(45) Date of Patent: Nov. 25, 2008

(54) FILLING DEVICE AND METHOD FOR FILLING BALLS IN THE APERTURES OF A BALL-RECEIVING ELEMENT

(75) Inventors: Francis Bourrières, Montauban (FR); Clément Kaiser, Montauban (FR)

(73) Assignee: Novatec SA, Mountauban (FR)

( * ) Notice: Subject to any disclaimer, the term of this patent is extended or adjusted under 35 U.S.C. 154(b) by 0 days.

(21) Appl. No.: 10/637,497

(22) Filed: Aug. 11, 2003

(65) Prior Publication Data
US 2004/0035908 A1  Feb. 26, 2004

Related U.S. Application Data

(62) Division of application No. 09/936,734, filed on Dec. 20, 2001, now Pat. No. 6,604,673.

(30) Foreign Application Priority Data

Mar. 17, 1999 (FR) .................................. 99 03284
Sep. 10, 1999 (FR) .................................. 99 11349

(51) Int. Cl.
   *B23K 37/00* (2006.01)
(52) U.S. Cl. ..................................... 228/41; 228/246
(58) Field of Classification Search ................ 228/246, 228/245, 41, 180.22, 56.3
   See application file for complete search history.

(56) References Cited

U.S. PATENT DOCUMENTS

| 3,534,964 A | * | 10/1970 | Guill | ................. | 273/144 A |
| 4,487,370 A | * | 12/1984 | Speicher | ................. | 239/687 |
| 4,611,555 A | * | 9/1986 | Burford | ................. | 118/684 |
| 5,088,639 A | | 2/1992 | Gondotra et al. | | |
| 5,279,045 A | * | 1/1994 | Odashima et al. | ................. | 34/360 |
| 5,380,957 A | * | 1/1995 | Giles | ................. | 177/16 |
| 5,431,332 A | | 7/1995 | Kirby et al. | | |
| 5,626,277 A | * | 5/1997 | Kawada | ................. | 228/41 |
| 5,653,381 A | | 8/1997 | Azdasht | | |
| 5,655,704 A | | 8/1997 | Sakemi et al. | | |
| 5,849,132 A | | 12/1998 | Chiu | | |

(Continued)

FOREIGN PATENT DOCUMENTS

| DE | 19838532 A1 | 4/1999 |
| EP | 0 623 221 A1 | 4/1988 |
| EP | 0263221 | 4/1988 |
| EP | 0 603 623 A2 | 6/1994 |
| EP | 0 685 879 A1 | 12/1995 |

(Continued)

OTHER PUBLICATIONS

International Search Report for International Application Serial No. PCT/IB00/00373, issued by the European Patent Office on Jul. 12, 2000, pp. 1-2.

*Primary Examiner*—Kiley Stoner
(74) *Attorney, Agent, or Firm*—Renner, Otto, Boisselle & Sklar, LLP

(57) ABSTRACT

A filling device for and a method of filling balls in an array of apertures in a ball-receiving element, the filling device comprising: a housing including an opening at a lower surface thereof and defining in part a chamber for containing a supply of balls, the housing being in use movably disposed over a ball-receiving element including an array of apertures; and distribution means disposed within the housing for distributing balls contained in the chamber such as to maintain a limited number of layers of the balls over at least a region of the opening in the housing.

29 Claims, 8 Drawing Sheets

U.S. PATENT DOCUMENTS

| | | | |
|---|---|---|---|
| 5,861,323 A | 1/1999 | Hayes | |
| 5,918,792 A | 7/1999 | Stumpe et al. | |
| 6,003,753 A * | 12/1999 | Hwang et al. | 228/41 |
| 6,182,356 B1 | 2/2001 | Bolde | |
| 6,227,437 B1 * | 5/2001 | Razon et al. | 228/254 |
| 6,253,992 B1 * | 7/2001 | Fjelstad | 228/245 |
| 6,336,581 B1 | 1/2002 | Tuchiya et al. | |
| 6,386,433 B1 * | 5/2002 | Razon et al. | 228/246 |
| 6,604,673 B1 * | 8/2003 | Bourrieres et al. | 228/246 |
| 6,634,545 B2 * | 10/2003 | Razon et al. | 228/246 |
| 6,830,175 B2 * | 12/2004 | Ito | 228/41 |
| 2002/0053591 A1 * | 5/2002 | Razon et al. | 228/258 |
| 2004/0035908 A1 * | 2/2004 | Bourrieres et al. | 228/49.6 |

FOREIGN PATENT DOCUMENTS

| | | | |
|---|---|---|---|
| EP | 0 697 727 A2 | 12/1995 | |
| EP | 0 697 727 A2 | 2/1996 | |
| EP | 0 902 610 A1 | 3/1999 | |
| JP | 59-22391 | 5/1984 | |
| JP | 408064945 A | * | 3/1996 |
| JP | 09027677 A | * | 1/1997 |
| JP | 409186164 A | * | 7/1997 |
| JP | 3053168 | 8/1998 | |
| JP | 2000077452 A | * | 3/2000 |

\* cited by examiner

FILLING DEVICE AND METHOD FOR FILLING BALLS IN THE APERTURES OF A BALL-RECEIVING ELEMENT

This is a divisional of application Ser. No. 09/936,734, filed Dec. 20, 2001 now U.S. Pat. No. 6,604,673, which claims priority to PCT/IB00/00373 filed Mar. 17, 2000.

The present invention relates to a filling device for and a method of filling balls, in particular solder balls, in the apertures of a ball-receiving element, in particular a mask or template, for application as a ball grid array.

With the ever increasing integration of electronic chips, ball grid array packages are finding increasing application as, for example, high density input/output chip carriers.

A known filling device for filling solder balls in the apertures of a mask or template for application on a substrate as a ball grid array is, for example, disclosed in U.S. Pat. No. 5,655,704.

Figure 1:
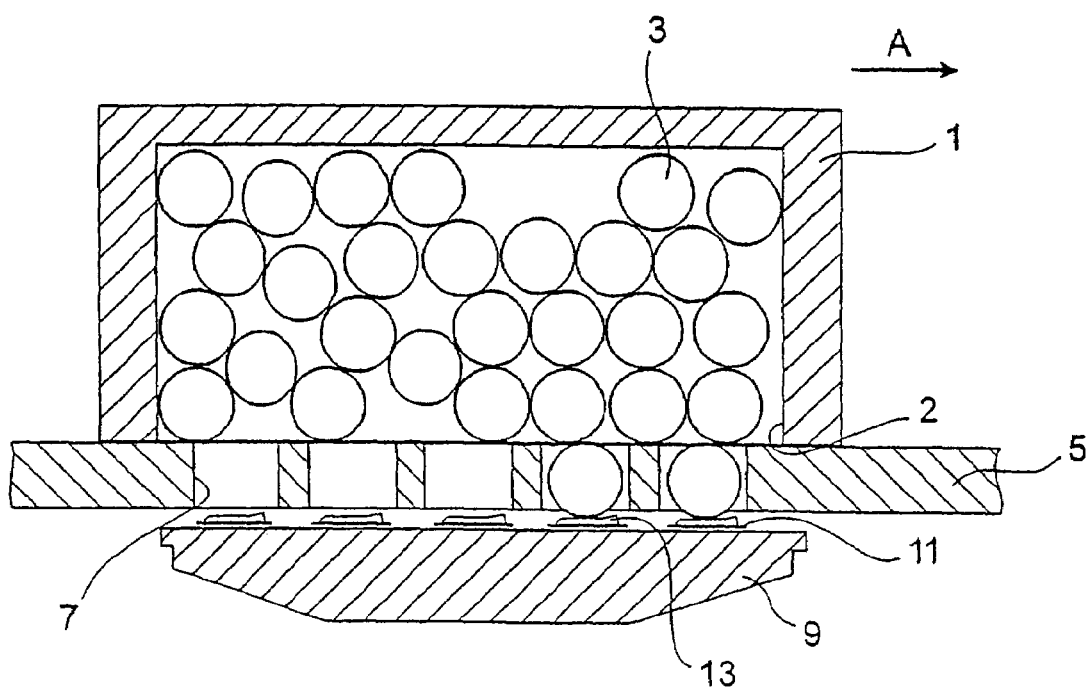

Such a filling device, as represented schematically in FIG. 1, comprises a container 1 which includes an opening 2 at a lower surface thereof and contains a supply of solder balls 3. The container 1 is movably disposed over the upper surface of a ball-receiving element 5 which includes an array of apertures 7 defining the pattern of the required ball grid array. The ball-receiving element 5 is located above a substrate 9, typically of a ceramic or plastics material, which includes an array of contact pads 11 each having an adhesive layer 13, typically of a flux, provided thereon for retaining a solder ball 3 prior to reflow of the solder. In use, a substrate 9 is located beneath the ball-receiving element 5 such that the contact pads 11 thereon are brought into registration with the apertures 7 in the ball-receiving element 5. The container 1 is then moved (as indicated by arrow A) over the region of the ball-receiving element 5 which includes the array of apertures 7 such that solder balls 3 can fill the apertures 7. With the container 1 remote from the array of apertures 7, the substrate 9 is removed from beneath the ball-receiving element 5, with the solder balls 3 being held in position by the adhesive layers 13, and then heated in an oven to cause reflow of the solder.

Whilst such a filling device is functional, there are a number of problems associated with this filling device which reduce the filling efficiency. One significant problem arises from the need to maintain a large quantity of solder balls in the container in order to ensure a supply of solder balls over the entire area of the opening in the container. The provision of such a large quantity of solder balls, as a plurality of layers, leads to forces having a relatively high horizontal component between adjacent solder balls, the solder balls and the container and the solder balls and the ball-receiving element during movement of the container.

The existence of those forces significantly reduces the filling efficiency of the filling device as the horizontal component of those forces acts to restrain the solder balls from falling freely under the influence of gravity into the apertures. As will be appreciated, any restraint to the vertical movement of the solder balls decreases the filling efficiency as the time period in which a solder ball and an aperture are sufficiently in registration to allow the solder ball to enter the aperture is very short, typically of the order of a few milliseconds. Indeed, with such a filling device it is not uncommon, particularly at sweeping speeds of greater than 10 mm/s, for many apertures to be empty after sweeping the filling device over the ball-receiving element. Such a poor filling efficiency is highly undesirable for the reason that to achieve complete filling either several sweeps of the filling device at a relatively low speed would be necessary or alternatively a subsequent expensive and delicate repair operation would be necessary.

Figure 2:
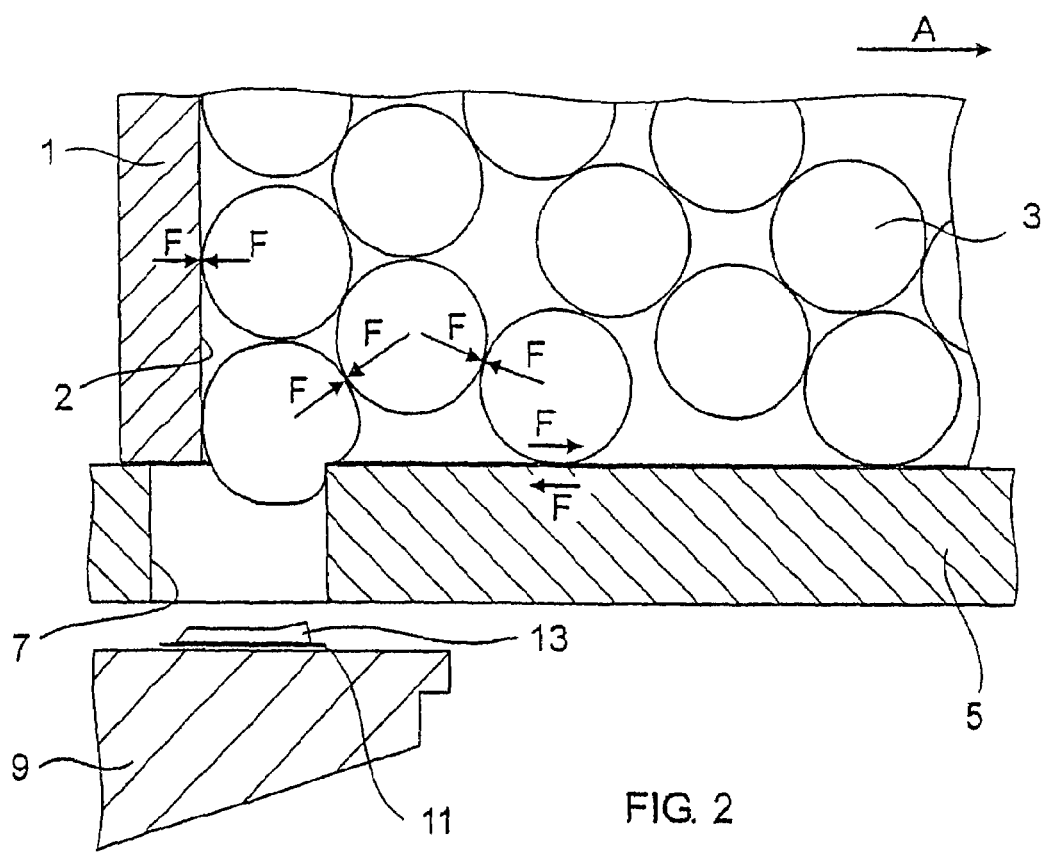

In addition, incomplete filling of the apertures is undesirable because when empty apertures are reached by the rear edge of the container, there is a real risk, as illustrated in FIG. 2, of solder balls being partly engaged in those empty apertures and sheared by the rear edge of the container, which sheared solder balls can subsequently enter apertures and prevent the required filling by complete solder balls as is necessary to achieve the required tolerances of the solder bumps of fabricated ball grid array packages, and also create debris which hinders the operation of the filling device.

The existence of these forces further reduces the filling efficiency of the filling device and impairs the condition of the solder balls in developing relatively high stresses at the surfaces of the solder balls which are sufficient to dull and even deform the solder balls, particularly when the container is moved at high speed.

It is thus an aim of the present invention to provide a filling device and a method which provides for the improved filling of balls in an array of apertures in a ball-receiving element.

Accordingly, the present invention provides a filling device for filling balls in an array of apertures in a ball-receiving element, the filling device comprising: a housing including an opening at a lower surface thereof and defining in part a chamber for containing a supply of balls, the housing being in use movably disposed over a ball-receiving element including an array of apertures; and distribution means disposed within the housing for distributing balls contained in the chamber such as to maintain a limited number of layers of the balls over at least a region of the opening in the housing.

Preferably, the distribution means is configured to provide substantially a single layer of balls over at least a region of the opening in the housing.

In one embodiment the distribution means comprises a track-defining member having a lower surface operably disposed in spaced relation to the lower surface of the housing such as to define a track of restricted height therebeneath then disposed over the ball-receiving element.

Preferably, the lower surface of the track-defining member is substantially planar.

Preferably, at least the lower surface of the track-defining member is formed of a resilient material.

Preferably, the track-defining member is spaced relative to the lower surface of the housing such as to define a track for a single layer of balls therebeneath.

In one preferred embodiment the track-defining member is spaced relative to the lower surface of the housing such as to define a channel having a height substantially equal to the diameter of the balls.

In another preferred embodiment at least the lower surface of the track-defining member is formed of a resilient material and the lower surface of the track-defining member is spaced relative to the lower surface of the housing such as to define a channel having a height less than the diameter of the balls, whereby balls are biased downwardly when located beneath the track-defining member.

Preferably, the track-defining member is movably disposed relative to the housing, and the filling device further comprises a loading element biasing the track-defining member downwardly relative to the lower surface of the housing.

More preferably, the biasing force of the loading element is such as to maintain a single layer of balls therebeneath.

In one preferred embodiment the ball-receiving element comprises a mask including an array of apertures.

In another preferred embodiment the ball-receiving element comprises a template including an array of apertures.

Preferably, the filling device further comprises a reservoir for containing a supply of balls and at least one channel connecting the reservoir to the chamber.

More preferably, the lower end of the at least one channel is spaced from the lower surface of the housing such as to restrict the fill level of balls in the chamber.

More preferably, the filling device comprises at least one channel adjacent a forward edge of the track-defining member in a direction of movement.

More preferably, the filling device comprises at least one channel adjacent each of forward and rearward edges of the track-defining member in a direction of movement.

More preferably, the filling device comprises a plurality of channels.

In another embodiment the distribution means comprises at least one channel through which balls are in use supplied to the chamber, the lower end of the at least one channel being spaced from the lower surface of the housing such as to restrict the fill level of balls at at least a region of the opening in the housing.

Preferably, the filling device comprises a plurality of channels.

In a further embodiment the distribution means comprises first and second downwardly-extending members which define an enclosed space therebeneath, the downwardly-extending members being configured to allow only a limited number of layers of balls to pass therebeneath.

In one preferred embodiment the first and second downwardly-extending members are laterally spaced.

In another preferred embodiment the first and second downwardly-extending members are downwardly and outwardly flared.

Preferably, the downwardly-extending members are formed of a resilient material.

In a yet further embodiment the distribution means comprises at least one projection extending inwardly of the housing and including a surface having a forward and downward component in a direction of movement.

In one preferred embodiment the at least one surface is a substantially planar surface.

In another preferred embodiment the at least one surface is a curved surface.

Preferably, the distribution means comprises first and second projections, each extending inwardly and including a surface having a forward and downward component in the respective directions of movement.

Preferably, the housing includes a wiper disposed internally along one, rearward edge thereof in a direction of movement.

More preferably, the housing includes wipers disposed internally along each of the edges thereof in the respective directions of movement.

Preferably, the balls comprise solder balls.

The present invention also provides a filling device for filling balls in an array of apertures in a ball-receiving element, the filling device comprising a housing movably disposed in use over a ball-receiving element including an array of apertures, wherein the housing defines at least in part a chamber for containing a supply of balls and includes at least first and second relatively movable parts movable between a first, open configuration in which an opening is defined at a lower surface thereof in communication with the chamber and a second, closed configuration in which the chamber is closed.

Preferably, the first and second movable parts are coupled by a threaded component which on rotation causes relative movement thereof.

More preferably, the first and second movable parts comprise the forward and rearward edges of the housing in a direction of movement.

The present invention further provides a filling device for filling balls in an array of apertures in a ball-receiving element, the filling device comprising: a housing including an opening at a lower surface thereof and defining in part a chamber for containing a supply of balls, the housing being in use movably disposed over a ball-receiving element including an array of apertures; and distribution means disposed within the housing for causing circulation of the balls contained in the chamber over at least a region of the opening in the housing.

The present invention still further provides a ball bumping apparatus comprising a ball bumping station comprising the above-described filling device and a ball-receiving element including an array of apertures over which the filling device is movably disposed.

Preferably, the ball bumping apparatus further comprises a stencil printing station for printing an array of ball-retaining deposits on a substrate, the stencil printing station comprising a stencil including an array of apertures having the same pattern as the array of apertures in the ball-receiving element, and a print head for delivering a ball-retaining material to the surface of the stencil.

More preferably, the filling device and the print head are configured to be operable in unison such as to print ball-retaining deposits on one substrate at the same time as providing a ball grid array on another substrate.

The present invention yet further provides a ball bumping apparatus comprising a stencil printing machine having the above-described filling device fitted thereto. One suitable stencil printing machine is the DEK 265 screen printing machine as manufactured by DEK Printing Machines Ltd.

The present invention still yet further provides a ball bumping apparatus, comprising: a ball bumping station comprising a filling device for filling balls in an array of apertures in a ball-receiving element, the filling device comprising a housing including an opening at a lower surface thereof and defining in part a chamber for containing a supply of balls, and a ball-receiving element including an array of apertures over which the filling device is in use movably disposed; and a stencil printing station for printing an array of ball-retaining deposits on a substrate, the stencil printing station comprising a stencil including an array of apertures having the same pattern as the array of apertures in the ball-receiving element, and a print head for delivering a ball-retaining material to the surface of the stencil.

The present invention still yet further provides a method of filling balls in an array of apertures in a ball-receiving element, comprising the steps of: providing a filling device over a ball-receiving element including a plurality of apertures, the filling device comprising a housing including an opening at a lower surface thereof and defining in part a chamber containing a supply of balls, and distribution means disposed within the housing for distributing the balls contained in the chamber such as to maintain a limited number of layers of the balls over at least a region of the opening in the housing; and moving the filling device relative to the ball-receiving element such as to cause the filling of the apertures in the ball-receiving element.

Figure 3:
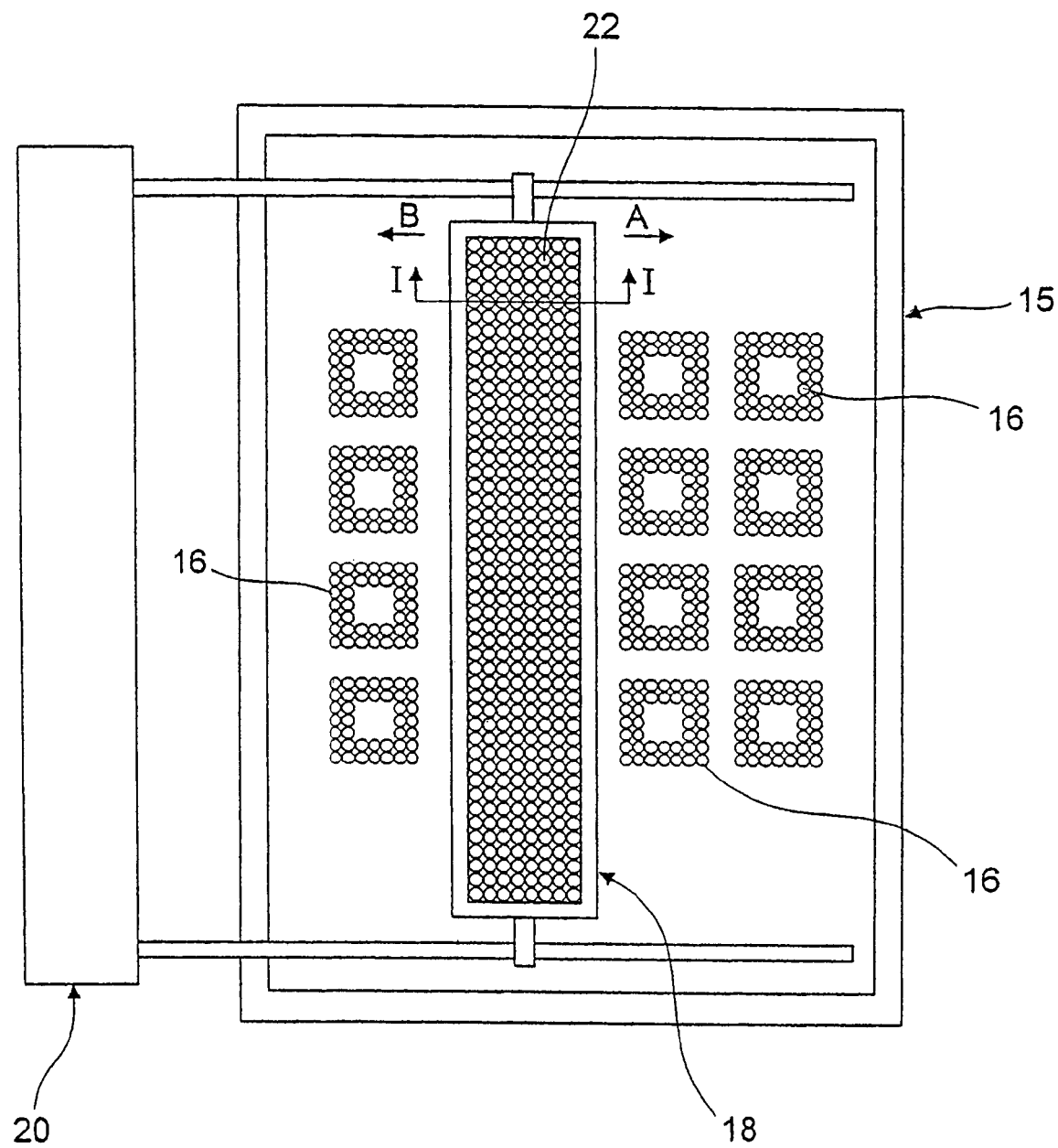
Figure 4:
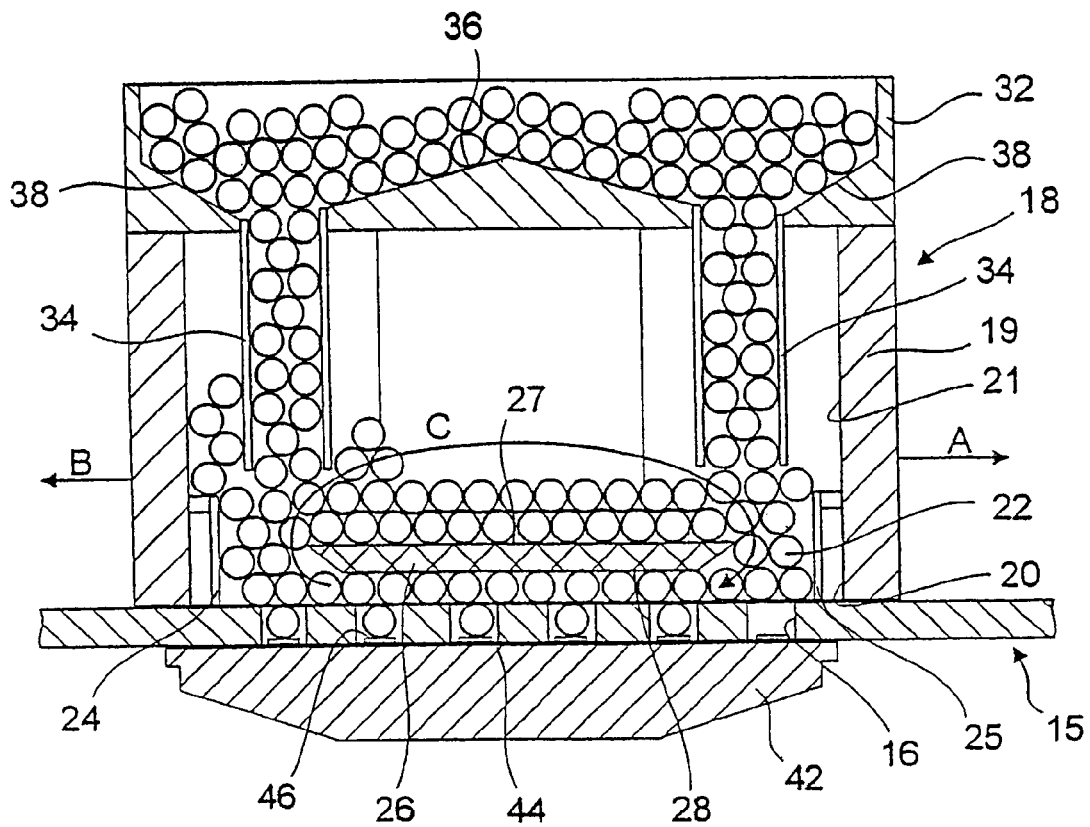
Figure 5:
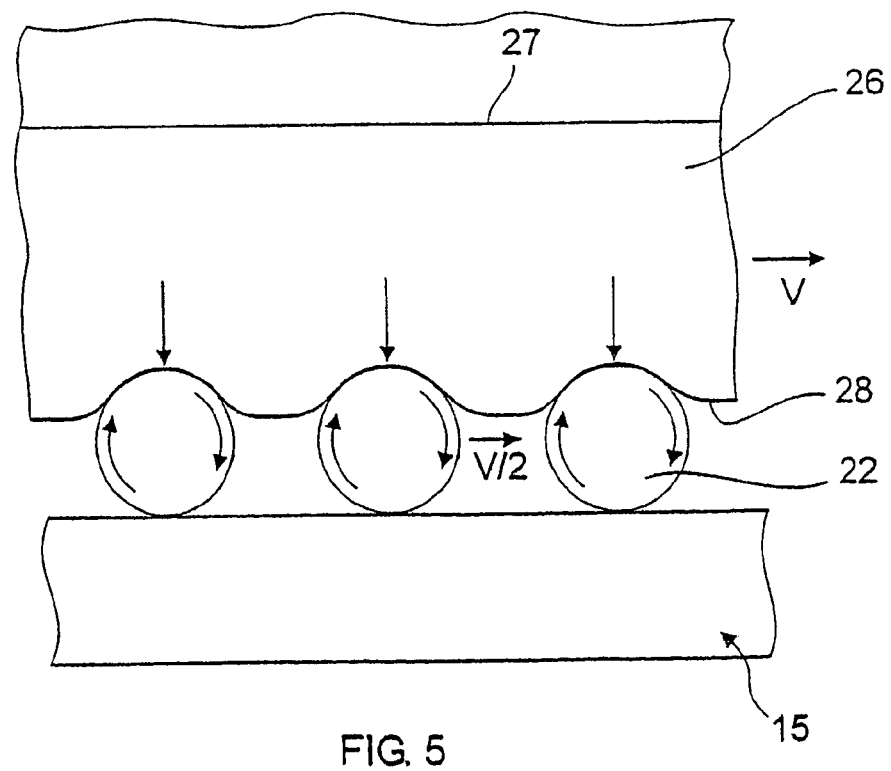
Figure 6:
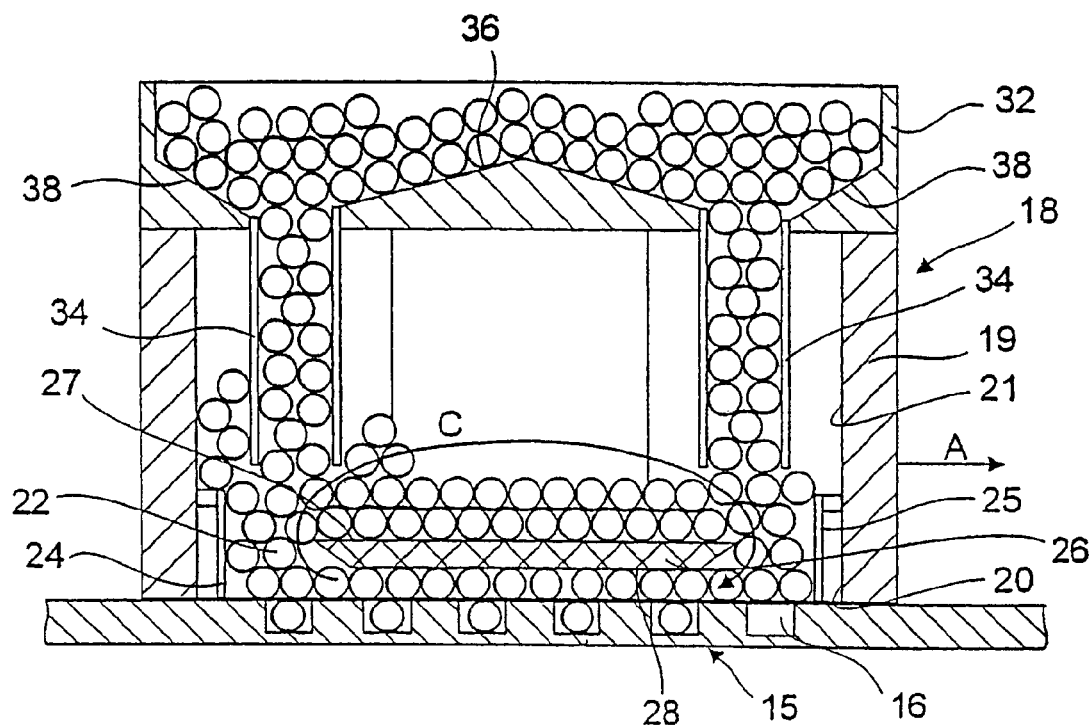
Figure 7:
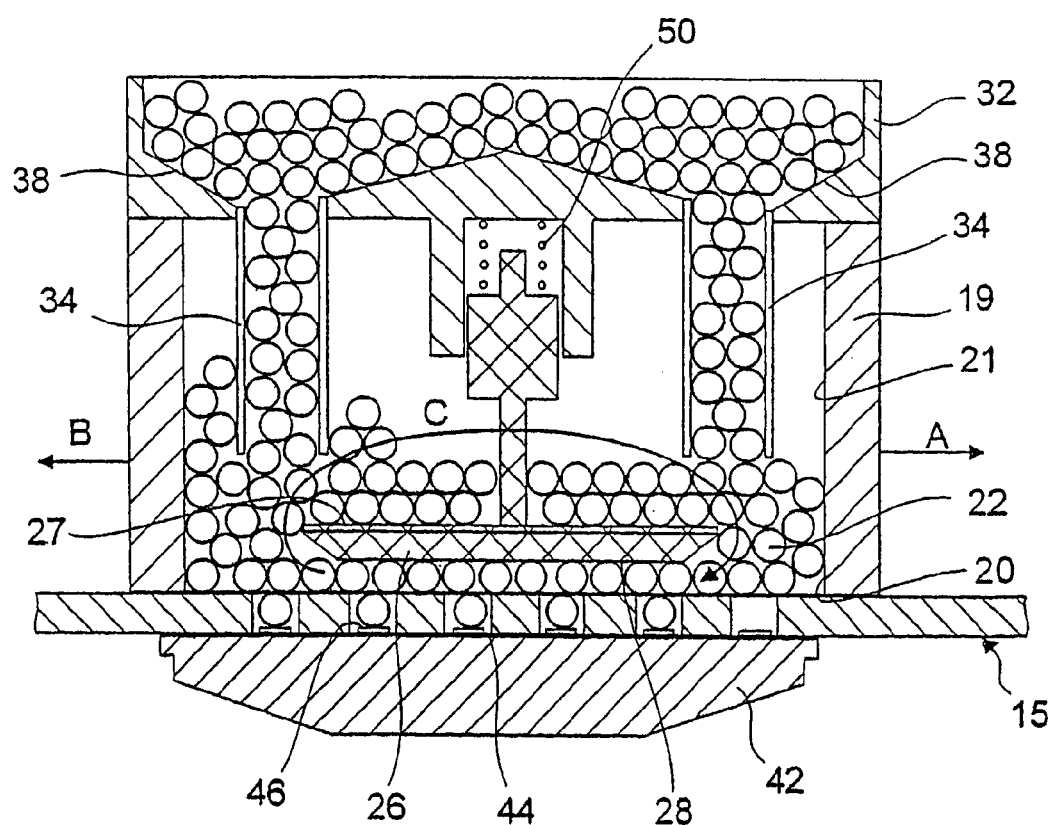
Figure 8:
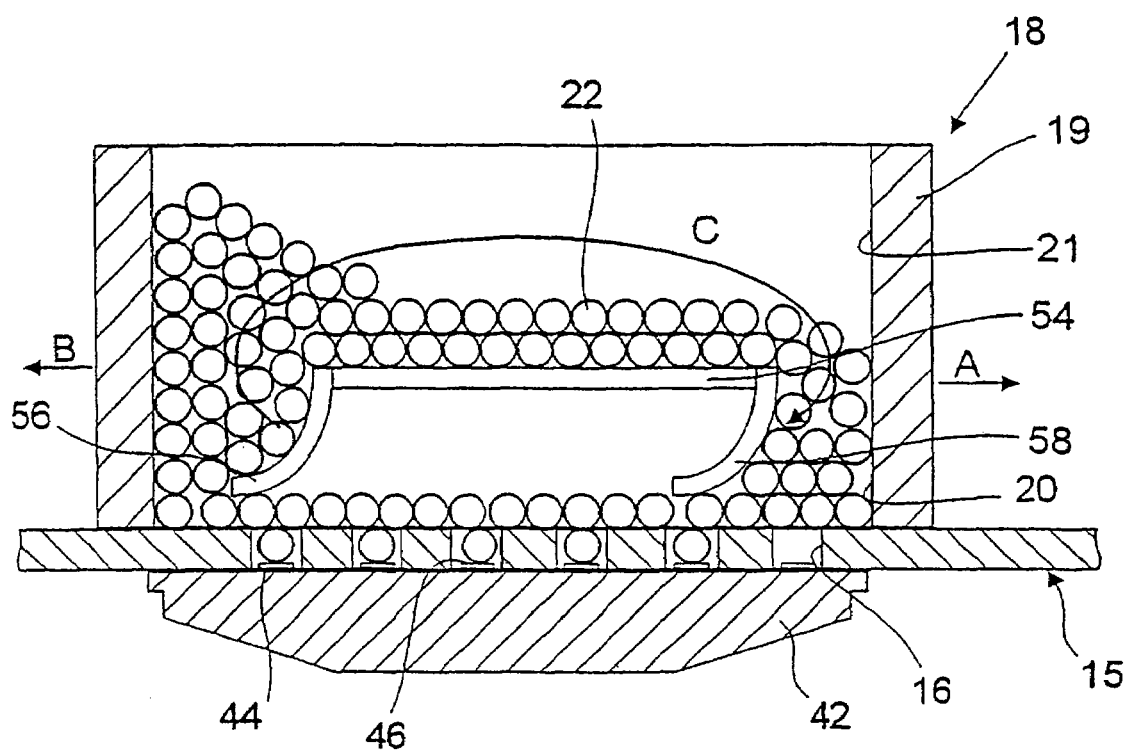
Figure 9:
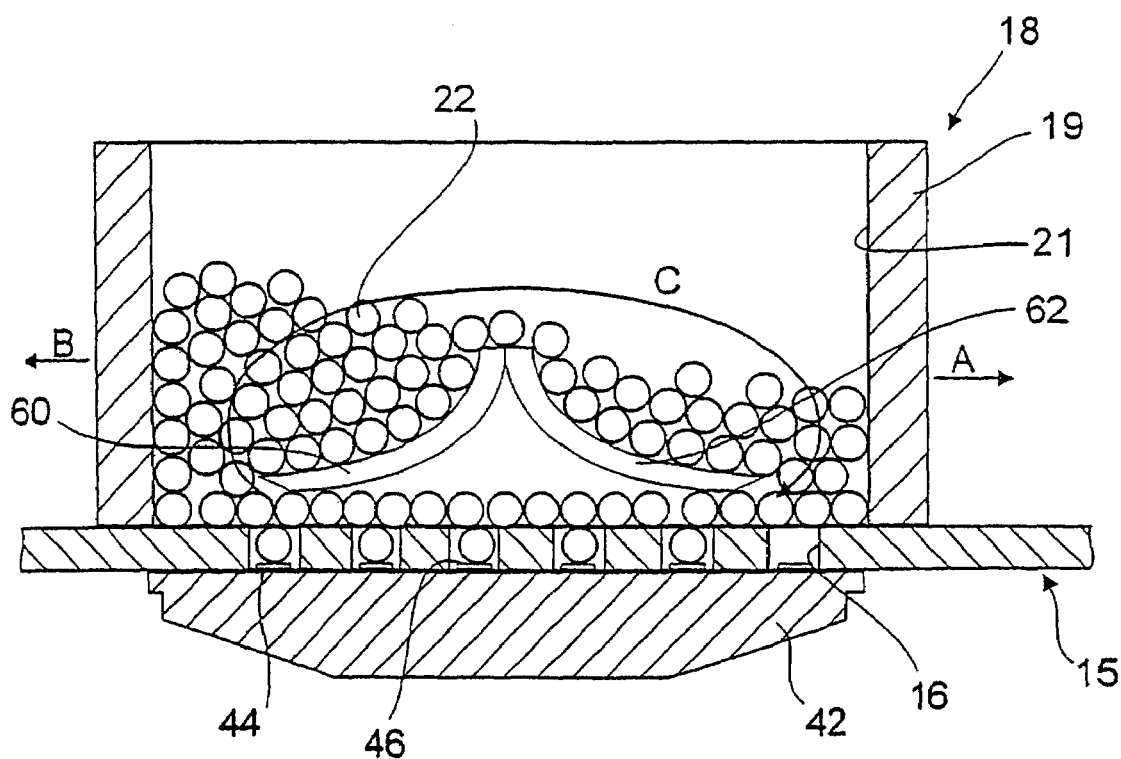
Figure 10:
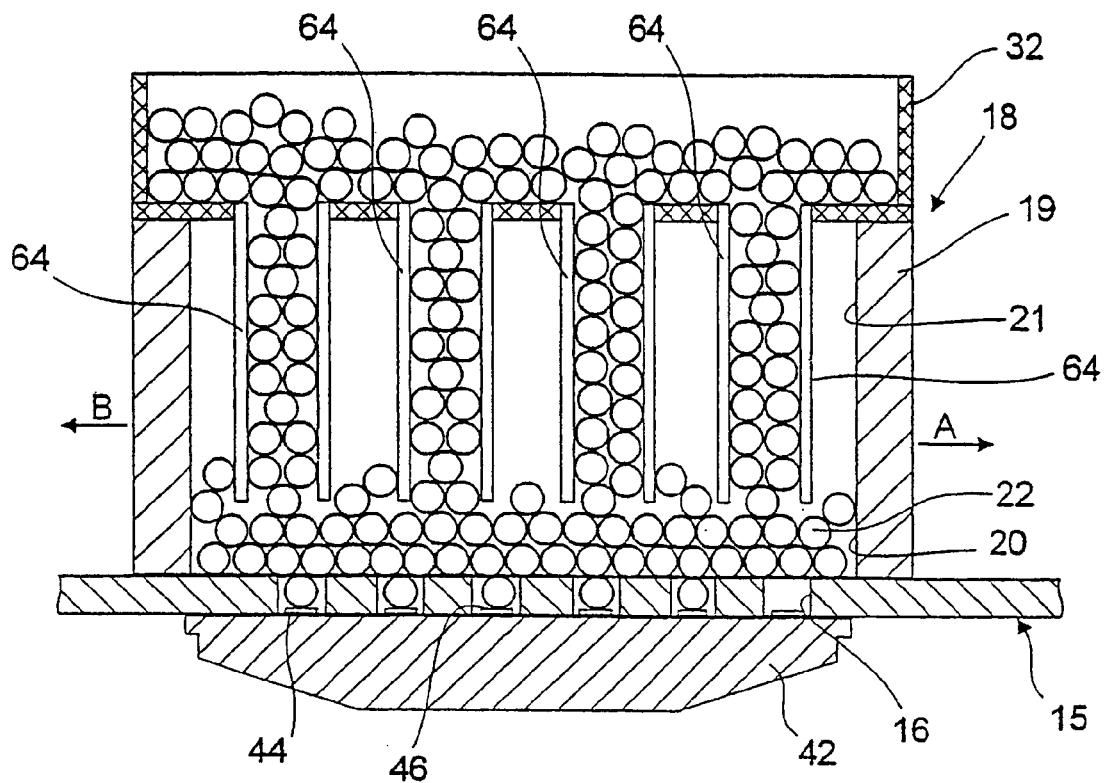
Figure 11:
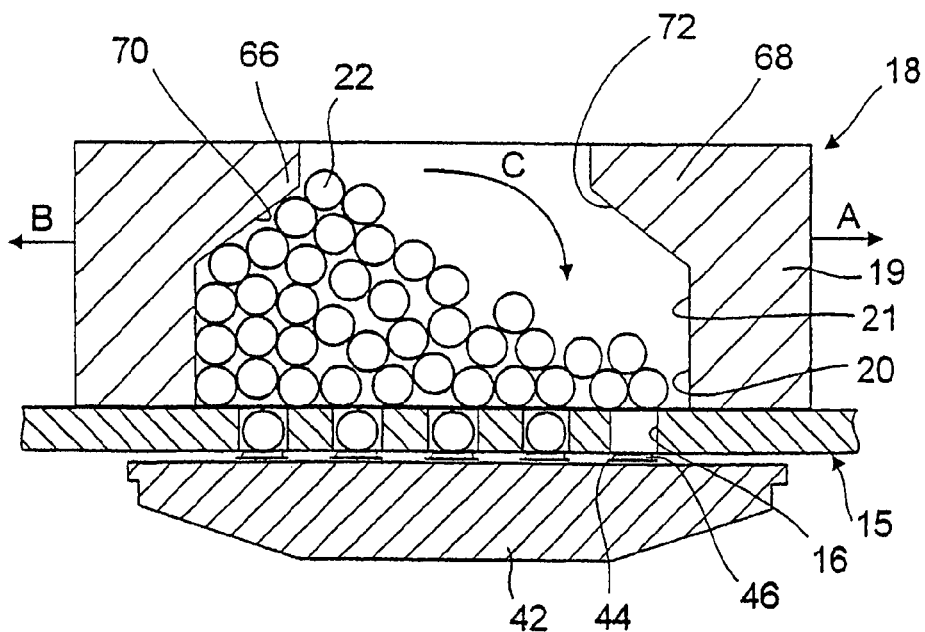
Figure 12:
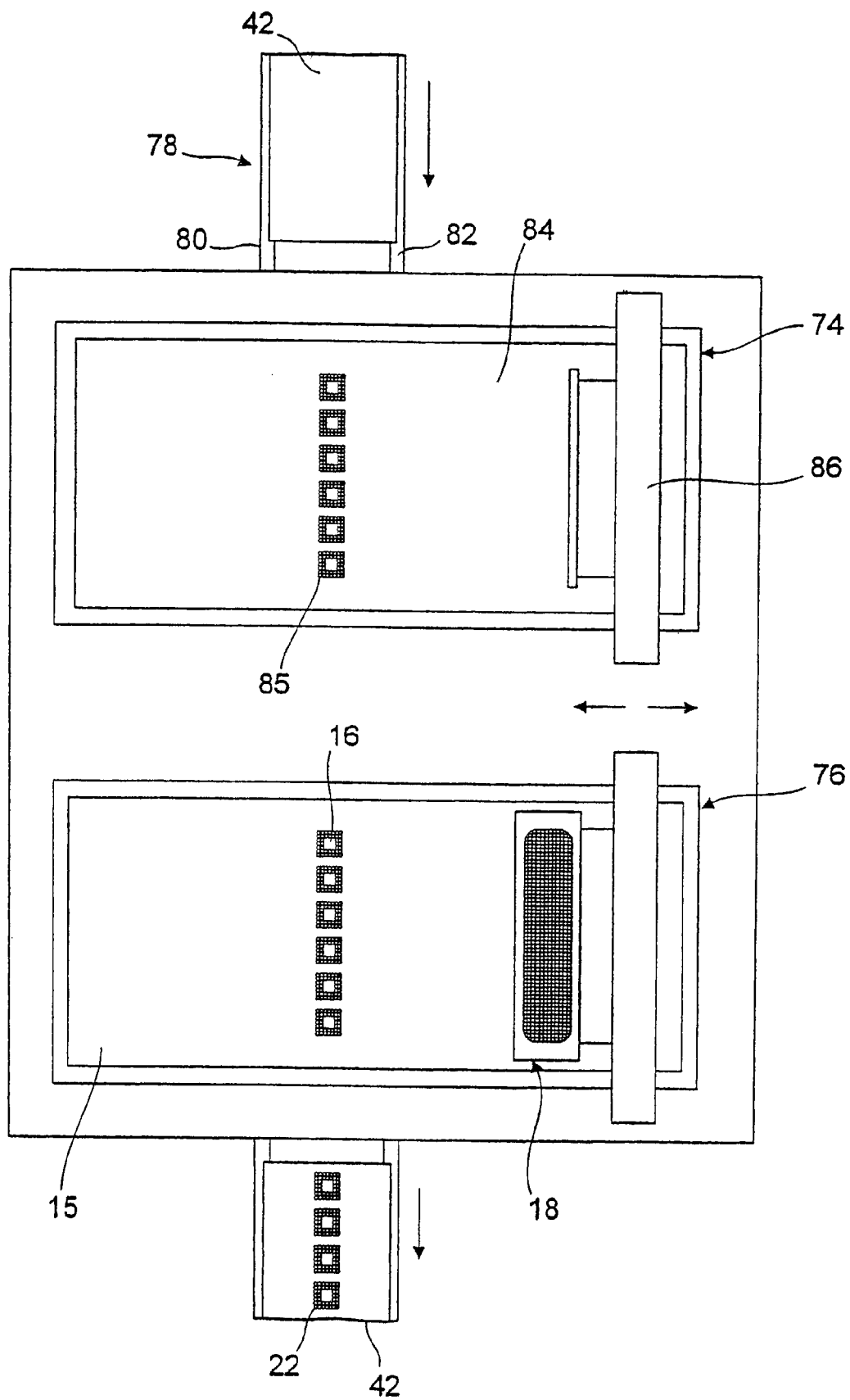
Figure 13A:
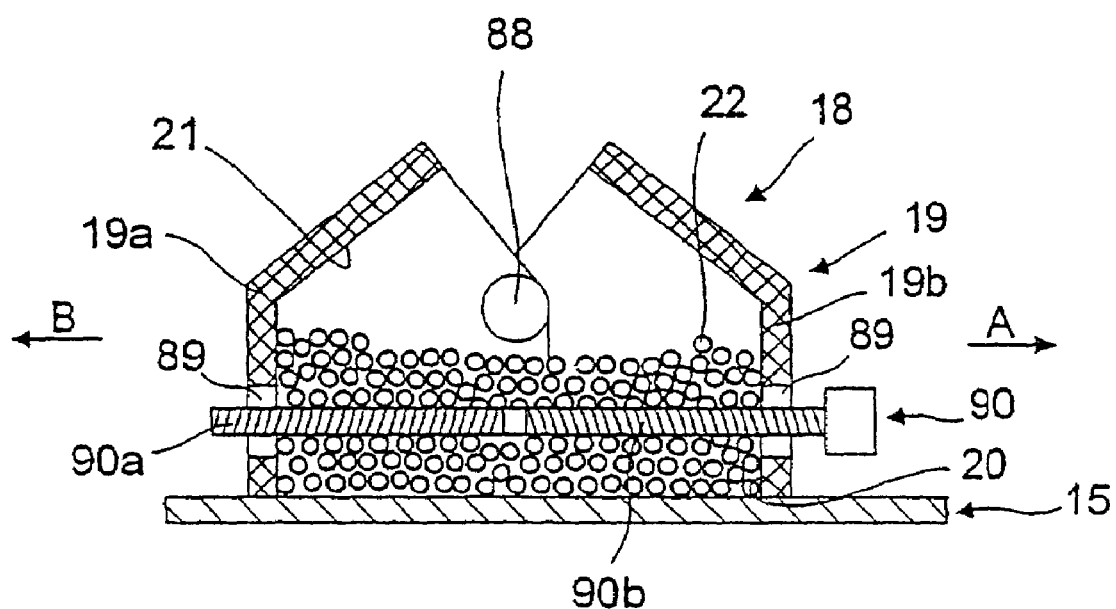

Preferred embodiments of the present invention will now be described hereinbelow by way of example only with reference to the accompanying drawings, in which:

FIG. 1 schematically illustrates a vertical sectional view of the filling device of a prior art ball bumping apparatus;

FIG. 2 illustrates an enlarged fragmentary vertical sectional view of the filling device of FIG. 1;

FIG. 3 schematically illustrates a plan view of a ball bumping apparatus in accordance with a first embodiment of the present invention;

FIG. 4 schematically illustrates a vertical sectional view (along section I—I) of the filling device of the ball bumping apparatus of FIG. 3;

FIG. 5 schematically illustrates an enlarged fragmentary vertical sectional view of the filling device of FIG. 3;

FIG. 6 schematically illustrates a vertical sectional view (along section I—I) of the filling device of a ball bumping apparatus in accordance with a second embodiment of the present invention;

FIG. 7 schematically illustrates a vertical sectional view (along section I—I) of the filling device of a ball bumping apparatus in accordance with a third embodiment of the present invention;

FIG. 8 schematically illustrates a vertical sectional view (along section I—I) of the filling device of a ball bumping apparatus in accordance with a fourth embodiment of the present invention;

FIG. 9 schematically illustrates a vertical sectional view (along section I—I) of the filling device of a ball bumping apparatus in accordance with a fifth embodiment of the present invention;

FIG. 10 schematically illustrates a vertical sectional view (along section I—I) of the filling device of a ball bumping apparatus in accordance with a sixth embodiment of the present invention;

FIG. 11 schematically illustrates a vertical sectional view (along section I—I) of the filling device of a ball bumping apparatus in accordance with a seventh embodiment of the present invention;

FIG. 12 schematically illustrates a plan view of a ball bumping apparatus in accordance with an eighth embodiment of the present invention; and FIGS. 13(a) and (b) illustrate vertical sectional views (along section I—I) of the filling device of a ball bumping apparatus in accordance with a ninth embodiment of the present invention, illustrated in the open and the closed configurations respectively.

FIGS. 3 to 5 illustrate a ball bumping apparatus in accordance with a first embodiment of the present invention.

The ball bumping apparatus comprises a ball-receiving element 15, in this embodiment a mask, which includes a plurality of arrays of apertures 16 arranged in groups, each in a pattern corresponding to a required ball grid array, a filling device 18 which is movably disposed over the upper surface of the ball-receiving element 15, and a drive unit 20 for sweeping the filling device 18 bi-directionally (as indicated by arrows A and B) over the upper surface of the ball-receiving element 15.

In this embodiment the ball-receiving element 15 is formed of a metal, particularly a non-oxidising metal such as stainless steel, copper or brass, so as to prevent the undesirable accumulation of static charge. In alternative embodiments the ball-receiving element 15 can be formed of a plastics material coated with a metal, such as copper or nickel, or a static-dissipating plastics material, such as Teflon™ or a carbon-loaded polyester. The ball-receiving element 15 is of substantially the same thickness as the diameter of the solder balls 22 and the apertures 16 in the ball-receiving element 15 are of greater radial dimension than the solder balls 22, in this embodiment circular apertures having a diameter of about 1.7 times that of the solder balls 22.

The filling device 18 comprises a housing 19, in this embodiment of rectangular shape with the longitudinal edges thereof being the forward and rearward edges in the directions of movement, which includes an opening 20 at the lower surface thereof and defines in part a chamber 21 in which solder balls 22 are contained. In this embodiment the housing 19 is configured to be in sliding contact with the upper surface of the ball-receiving element 15, but in alternative embodiments could be configured to be spaced from the ball-receiving element 15 by up to a distance equal to the radius of the solder balls 22. In this embodiment the opening 20 at the lower surface of the housing 19 has a lengthwise dimension greater than the extent of the groups of arrays of apertures 16 in the direction orthogonal to the direction of movement. The housing 19 further includes first and second wipers 24, 25, in this embodiment formed of a resilient material, spaced internally along the longitudinal edges thereof. The wipers 24, 25 act to dislodge any solder balls 22 which may be partly engaged in empty apertures 16 and thereby prevent those trapped solder balls 22 from being sheared by the rearward longitudinal edge of the housing 19. In this embodiment the housing 19 is formed of a metal, particularly a non-oxidising metal such as stainless steel, copper or brass, so as to prevent the undesirable accumulation of static charge. In alternative embodiments the housing 19 can be formed of a plastics material coated with a metal, such as copper or nickel, or a static-dissipating plastics material, such as Teflon™ or a carbon-loaded polyester.

The filling device 18 further comprises a track-defining member 26, in this embodiment a substantially planar elongate element having substantially planar upper and lower surfaces 27, 28, disposed within the housing 19 such that the lower surface 28 thereof is spaced in parallel relation from the lower surface of the housing 19 so as to define a track through which a single layer of solder balls 22 is in use circulated (as indicated by arrow C). The track defining member 26 is of such a dimension that the longitudinal edges thereof are spaced from the wipers 24, 25 at the longitudinal edges of the housing 19 so as to define elongate openings through which the solder balls 22 can circulate. In this embodiment the longitudinal edges of the track-defining member 26 are tapered so as to facilitate the inflow and outflow of the solder balls 22 beneath the track-defining member 26. The track-defining member 26 is formed of a resilient material, in this embodiment a rubber, which has a high coefficient of friction with respect to the material of the solder balls 22. Suitable rubber materials include foam rubbers, in particular silicone foam rubbers. The spacing between the lower surface 28 of the track-defining member 26 and the lower surface of the housing 19 is such that when disposed above the upper surface of the ball-receiving element 15 the distance between the lower surface 28 of the track-defining member 26 and the upper surface of the ball-receiving element 15 is less than or equal to the diameter of the solder balls 22, in this embodiment about two-thirds of the diameter of the solder balls 22.

With this configuration, a single layer of solder balls 22 is maintained on the upper surface of the ball-receiving element 15 when the filling device 18 is moved thereover, with the track-defining member 26 applying a downward force to each of the solder balls 22 therebeneath such as to bias the solder balls 22 downwardly and frictionally grip the solder balls 22 so as to cause the solder balls 22 to rotate over the surface of the ball-receiving element 15 on movement of the filling device 18. This configuration, in providing a single layer of solder balls 22 over a major portion of the surface of the opening 20 in the housing 19, requires a much reduced quantity of solder balls 22 for effective operation and is also effective in disintegrating any agglomerates of solder balls 22 which may be present, such agglomerates usually occurring because of the presence of static charges, dampness or pollutants.

This rolling action of the solder balls 22 is particularly advantageous in reducing the effective speed of the solder balls 22 over the ball-receiving element 15, that is, where the filling device 18 is moved at a speed V, the effective speed of the solder balls 22 over the ball-receiving element 15 is a half that speed, namely, V/2. Reducing the effective speed of the solder balls 22 is advantageous since, as mentioned above, the filling efficiency is directly proportional to the time a solder ball 22 is resident over any of the apertures 16, and by halving the effective speed of the solder balls 22 the time that any of the solder balls 22 is resident over an aperture 16 is doubled.

Another particular advantage of this rolling action of the solder balls 22 is that the solder balls 22 are not subject to any significant lateral forces which could prevent the gravitational flow of the solder balls 22 into the apertures 16 in the ball-receiving element 15.

A further advantage of this rolling action of the solder balls 22 is that the solder balls 22 are not in sliding contact with the ball-receiving element 15, thereby avoiding deformation caused by frictional sliding.

A yet further advantage of this rolling action of the solder balls 22 beneath the track-defining member 26 is that solder balls 22 are drawn under the forward edge thereof in the respective direction of movement and those solder balls 22 which have not fallen into the apertures 16 in the ball-receiving element 15 are expelled beyond the rear edge thereof, thereby maintaining a positive circulation of the solder balls 22 rearwardly under the lower surface 28 of track-defining member 26, with the build up of solder balls 22 at the rear edge of the track-defining member 26 circulating forwardly over the upper surface 27 thereof under the action of gravity. This circulatory motion is indicated by arrow C in FIG. 4.

The filling device 18 further comprises a reservoir 32 for containing a significant supply of solder balls 22 and a plurality of channels 34 connecting the reservoir 32 to the chamber 21. By arranging the principal supply of solder balls 22 separately from the chamber 21, the number of solder balls 22 in the chamber 21 is kept to a minimum so as to promote the circulatory motion of the solder balls 22 about the track-defining member 26. The reservoir 32 includes a lower surface 36 shaped in the manner of a plurality of funnels 38 associated with each channel 34 such as to promote the flow of the solder balls 22 thereinto. The channels 34 are located adjacent the longitudinal edges of the track-defining member 26 such as to maintain a supply of solder balls 22 at the forward edge of the track-defining member 26 in either direction of movement of the filling device 18. The lower ends of the channels 34 are spaced from the upper surface 27 of the track-defining member 26, preferably by a distance of about three to ten ball diameters, so as to restrict the fill level of solder balls 22 in the chamber 21.

In use, with the filling device 18 in the rest position as illustrated in FIG. 3, substrates 42, typically formed of a ceramic or plastics material, which include an array of contact pads 44 each having an adhesive layer 46, typically of a flux, provided thereon for retaining a solder ball 22, are located beneath the ball-receiving element 15 in registration with each of the groups of arrays of apertures 16, and the filling device 18 is moved reciprocatingly under the under the action of the drive unit 20 so as to sweep each of the groups of arrays of apertures 16 at least once so as provide for complete filling of the apertures 16. With the filling device 18 returned to the rest position, the substrates 42 are removed from beneath the ball-receiving element 15 for subsequent inspection and reflow. This operation can then be repeated for putting down ball grid arrays on further substrates 42.

FIG. 6 illustrates the filling device of a ball bumping apparatus in accordance with a second embodiment of the present invention.

This ball bumping apparatus is very similar to that of the ball bumping apparatus of the above-described first embodiment, and thus, in order to avoid unnecessary duplication of description, only the differences will be described in detail, with like parts being designated by like reference signs.

The ball bumping apparatus differs only in that the ball-receiving element 15 comprises a template as opposed to a mask and the apertures 16 comprise cavities for holding the solder balls 22, which apertures 16 have a depth substantially equal to the diameter of the solder balls 22. In an alternative embodiment the apertures 16 can comprise through holes where the through holes have a radial dimension smaller than the diameter of the solder balls 22 so as to prevent the solder balls 22 from falling therethrough.

Operation of the ball bumping apparatus is the same as for the above-described first embodiment, except that a further operation is required to transfer the template holding the solder balls 22 to a substrate.

FIG. 7 illustrates the filling device of a ball bumping apparatus in accordance with a third embodiment of the present invention.

This ball bumping apparatus is very similar to that of the ball bumping apparatus of the above-described first embodiment, and thus, in order to avoid unnecessary duplication of description, only the differences will be described in detail, with like parts being designated by like reference signs.

The ball bumping apparatus differs only in the manner of the connection of the housing 19 and the track-defining member 26 and in that the housing 19 includes no wipers 24, 25 at the longitudinal edges thereof.

The track-defining member 26 is vertically movably disposed to the housing 19, in this embodiment slideably disposed, and biased downwardly by a resilient element 50, in this embodiment a compression spring, so as to exert a loading force on the track-defining member 26. This configuration advantageously provides that the height of the track-defining member 26 automatically follows the diameter of the contained solder balls 22 so as to provide for self-adjustment, and therefore does not require any manual intervention on using solder balls 22 of different size. In an alternative embodiment the resilient element 50 can be omitted and instead the track-defining member 26 weighted to provide the required loading force.

Operation of the ball bumping apparatus of this embodiment is the same as for the ball bumping apparatus of the above-described first embodiment.

FIG. 8 illustrates the filling device of a ball bumping apparatus in accordance with a fourth embodiment of the present invention.

This ball bumping apparatus is quite similar to that of the ball bumping apparatus of the above-described first embodiment, and thus, in order to avoid unnecessary duplication of description, only the differences will be described in detail, with like parts being designated by like reference signs.

The ball bumping apparatus differs only in the construction of the filling device 18. The filling device 18 comprises a housing 19, in this embodiment of rectangular shape with the longitudinal edges being the forward and rearward edges in the directions of movement (as indicated by arrows A and B), which includes an opening 20 at the lower surface thereof and defines in part a chamber 21 in which solder balls 22 are contained. In this embodiment the housing 19 is configured to be in sliding contact with the upper surface of the ball-receiving element 15, but in alternative embodiments could be configured to be spaced from the ball-receiving element 15 by up to a distance equal to the radius of the solder balls 22. In this embodiment the opening 20 at the lower surface of the housing 19 has a lengthwise dimension greater than the extent of the groups of arrays of apertures 16 in the direction orthogonal to the direction of movement.

The filling device 18 further comprises a substantially planar elongate member 54 disposed within the housing 18 in spaced relation from the lower surface thereof and first and second downwardly-extending flexible vanes 56, 58 attached to the longitudinal edges of the elongate member 54. The flexible vanes 56, 58 are configured on movement of the filling device 18 to permit only a single layer of solder balls 22 to pass therebeneath such as to define a track through which a single layer of solder balls 22 is in use circulated, with a circulatory motion of the solder balls 22 being achieved (as indicated by arrow C). The vanes 56, 58 comprise a resilient material, in this embodiment a silicone foam, such as Poron™.

Operation of the ball bumping apparatus of this embodiment is the same as for the ball bumping apparatus of the above-described first embodiment.

FIG. 9 the filling device of a ball bumping apparatus in accordance with a fifth embodiment of the present invention.

This ball bumping apparatus is very similar to that of the ball bumping apparatus of the above-described fourth embodiment, and thus, in order to avoid unnecessary duplication of description, only the differences will be described in detail, with like parts being designated by like reference signs.

The ball bumping apparatus differs only in the construction of the filling device 18. The filling device 18 comprises a housing 19, in this embodiment of rectangular shape with the longitudinal edges being the forward and rearward edges in the directions of movement (as indicated by arrows A and B), which includes an opening 20 at the lower surface thereof and defines in part a chamber 21 in which solder balls 22 are contained. In this embodiment the housing 19 is configured to be in sliding contact with the upper surface of the ball-receiving element 15, but in alternative embodiments could be configured to be spaced from the ball-receiving element 15 by up to a distance equal to the radius of the solder balls 22. In this embodiment the opening 20 at the lower surface of the housing 19 has a lengthwise dimension greater than the extent of the groups of arrays of apertures 16 in the direction orthogonal to the direction of movement.

The filling device 18 further comprises first and second downwardly-extending and outwardly flared flexible scrapers 60, 62 disposed within the housing 19 in spaced relation from the lower surface thereof. The lower ends of the scrapers 60, 62 are each tapered in the direction of movement (as indicated by arrows A and B) and are configured on movement of the filling device 18 to permit only a single layer of solder balls 22 to pass therebeneath such as to define a track through which a single layer of solder balls 22 is in use circulated, with a circulatory motion of the solder balls 22 being achieved (as indicated by arrow C). The vanes 56, 58 comprise a resilient material, in this embodiment a silicone foam, such as Poron™.

Operation of the ball bumping apparatus of this embodiment is the same as for the ball bumping apparatus of the above-described fourth embodiment.

FIG. 10 illustrates the filling device of a ball bumping apparatus in accordance with a sixth embodiment of the present invention.

This ball bumping apparatus is quite similar to that of the ball bumping apparatus of the above-described first embodiment, and thus, in order to avoid unnecessary duplication of description, only the differences will be described in detail, with like parts being designated by like reference signs.

The ball bumping apparatus differs only in the construction of the filling device 18. The filling device 18 comprises a housing 19, in this embodiment of rectangular shape with the longitudinal edges being the forward and rearward edges in the directions of movement (as indicated by arrows A and B), which includes an opening 20 at the lower surface thereof and defines in part a chamber 21 in which solder balls 22 are contained. In this embodiment the housing 19 is configured to be in sliding contact with the upper surface of the ball-receiving element 15, but in alternative embodiments could be configured to be spaced from the ball-receiving element 15 by up to a distance equal to the radius of the solder balls 22. In this embodiment the opening 20 at the lower surface of the housing 19 has a lengthwise dimension greater than the extent of the groups of arrays of apertures 16 in the direction orthogonal to the direction of movement.

The filling device 18 further comprises a reservoir 32 for containing a supply of solder balls 22 and a plurality of channels 64 connecting the reservoir 32 to the chamber 21. The channels 64 are disposed in a uniform arrangement within the housing 19 so as to provide for uniform filling over the surface of the opening 20, and the lower ends of the channels 64 are spaced from the lower surface of the housing 19, preferably by a distance of about three to ten ball diameters, so as to restrict the fill level of the solder balls 22 in the chamber 21. By arranging the principal supply of solder balls 22 separately from the chamber 21, the number of solder balls 22 in the chamber 21 is kept to a minimum so as to allow for less restricted movement of the solder balls 22 in the chamber 21.

Operation of the ball bumping apparatus of this embodiment is the same as for the ball bumping apparatus of the above-described first embodiment.

FIG. 11 illustrates the filling device of a ball bumping apparatus in accordance with a seventh embodiment of the present invention.

This ball bumping apparatus is quite similar to that of the ball bumping apparatus of the above-described first embodiment, and thus, in order to avoid unnecessary duplication of description, only the differences will be described in detail, with like parts being designated by like reference signs.

The ball bumping apparatus differs only in the construction of the filling device 18. The filling device 18 comprises a housing 19, in this embodiment of rectangular shape with the longitudinal edges being the forward and rearward edges in the directions of movement (as indicated by arrows A and B), which includes an opening 20 at the lower surface thereof and defines in part a chamber 21 in which solder balls 22 are contained. In this embodiment the housing 19 is configured to be in sliding contact with the surface of the ball-receiving element 15, but in alternative embodiments could be configured to be spaced from the ball-receiving element 15 by up to a distance equal to the radius of the solder balls 22. In this embodiment the opening 20 at the lower surface of the housing 19 has a lengthwise dimension greater than the extent of the groups of arrays of apertures 16 in the direction orthogonal to the direction of movement. The housing 19 includes first and second projections 66, 68 which extend inwardly along the longitudinal edges thereof and are spaced from the opening 20. Each of the projections 66, 68 includes a surface 70, 72 having a downwardly facing component. In this embodiment the downwardly-facing surfaces 70, 72 are substantially planar surfaces which each enclose an acute angle with a surface parallel to the upper surface of the ball-receiving element 15. In an alternative embodiment the downwardly-facing surfaces 70, 72 could be curved, preferably concave, surfaces. With this configuration, the rearward of the downwardly-facing surfaces 70, 72 acts to cause the solder balls 22 which build up therebelow to roll forwards and thereby provide a circulatory motion of the solder balls 22 over the upper surface of the ball-receiving element 15 (as indicated by arrow C).

Operation of the ball bumping apparatus of this embodiment is the same as for the ball bumping apparatus of the above-described first embodiment.

FIG. 12 illustrates a ball bumping apparatus in accordance with an eighth embodiment of the present invention.

The ball bumping apparatus comprises a stencil printing station 74 for printing a plurality of arrays of deposits 46 of a ball-retaining material, such as viscous material, for example a solder flux, or an adhesive material, on a substrate 42, a ball bumping station 76 for providing solder balls 22 on each of the deposits 46 such as to provide a plurality of ball grid arrays, and a substrate transfer unit 78 for transferring substrates to the stencil printing station 74 and the ball bumping station 76.

The substrate transfer unit 78 is provided by first and second rails 80, 82 along which substrates 42 are transferred to the printing and ball providing locations in the stencil printing and ball bumping stations 74, 76.

The stencil printing station 74 comprises a stencil 84 which includes a plurality of arrays of apertures 85 defining the pattern to be deposited and a delivery unit 86 for delivering a ball-retaining material, in this embodiment a viscous material, through the stencil 84 to print the required pattern on the substrate 42. The ball-retaining material is of such a composition as to retain the solder balls 22 in position prior to reflow.

The ball bumping station 76 comprises the ball-retaining element 15 and the filling device 18 of any of the above-described embodiments.

In operation, a first substrate 42 is transferred by the substrate transfer unit 78 to the printing location in the stencil printing station 74. The delivery unit 86 of the stencil printing station 74 is then driven over the surface of the stencil 84 to deposit the ball-retaining material through the apertures 85 in the stencil 84 to provide the required pattern of deposits on the first substrate 42. The substrate transfer unit 78 is then further actuated to transfer that first substrate 42 to the ball fixing location in the ball bumping station 76 and at the same time transfer a second substrate 42 to the stencil printing location. Then, in unison, the delivery unit 86 of the stencil printing station 74 is driven over the surface of the stencil 84 to deposit ball-retaining material through the apertures 85 in the stencil 84 to provide the required pattern of deposits on the second substrate 42, and the filling head 18 is driven over the surface of the ball-receiving element 15 to fill each of the apertures 16 in the ball-retaining element 15 with solder balls 22 to provide solder balls 22 on each of the deposits printed on the first substrate 42. The substrate transfer unit 78 is then further actuated to transfer the first substrate 42 from the ball bumping apparatus for subsequent reflow of the solder, transfer the second substrate 42 to the ball fixing location in the ball bumping station 76, and transfer a third substrate 42 to the stencil printing location in the stencil printing station 74. This operation is then repeated, with the ball-retaining deposits being deposited on one substrate 42 at the same time as solder balls 22 are fixed to another substrate 42.

Figure 13B:
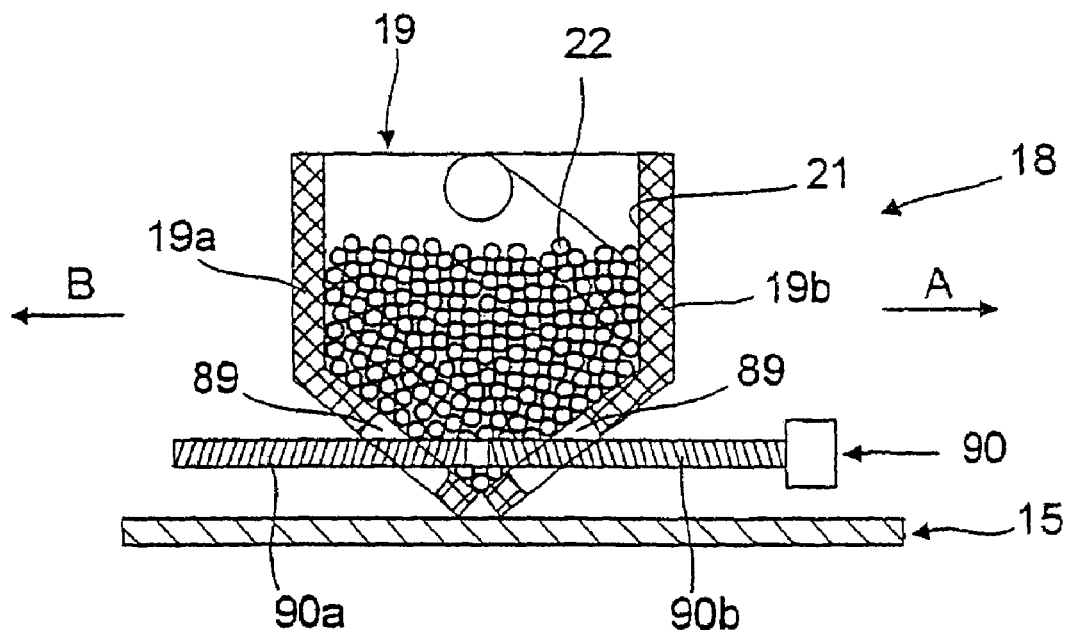

FIGS. 13(*a*) and (*b*) illustrate the filling device of a ball bumping apparatus in accordance with a ninth embodiment of the present invention.

This ball bumping apparatus is quite similar to that of the ball bumping apparatus of the above-described first embodiment, and thus, in order to avoid unnecessary duplication of description, only the differences will be described in detail, with like parts being designated by like reference signs.

The ball bumping apparatus differs only in the construction of the filling device 18. The filling device 18 comprises a housing 19, in this embodiment of rectangular shape with the longitudinal edges being the forward and rearward edges in the directions of movement (as indicated by arrows A and B), which defines at least in part a chamber 21 in which solder balls 22 are contained. The housing 19 comprises first and second parts 19*a*, 19*b* which are rotatable about a pivot 88 between a first, open configuration (as illustrated in FIG. 13(*a*)) in which the housing 19 includes an opening 20 at the lower surface thereof in communication with the chamber 21, and a second, closed configuration (as illustrated in FIG. 13(*b*)) in which the chamber 21 is closed so as to allow for the removal of the filling device 18 from the ball-receiving element 15 without any loss of the contained solder balls 22. Each of the parts 19*a*, 19*b* of the housing 19 includes a threaded member 89 rotatably mounted thereto, the purpose of which will become clear hereinbelow. In this embodiment the housing 19 is configured to be in sliding contact with the upper surface of the ball-receiving element 15, but in alternative embodiments could be configured to be spaced from the ball-receiving element 15 by up to a distance equal to the radius of the solder balls 22. In this embodiment the opening 20 at the lower surface of the housing 19 has a lengthwise dimension greater than the extent of the groups of arrays of apertures 16 in the direction orthogonal to the direction of movement.

The filling device 18 further comprises a threaded screw 90 having first and second counter-threaded sections 90*a*, 90*b* which when rotated in one of a clockwise or counter-clockwise sense cause the movable parts 90*a*, 90*b* to be moved to the one of the open and the closed configuration.

Operation of the ball bumping apparatus of this embodiment is the same as for the ball bumping apparatus of the above-described first embodiment.

Finally, it will be understood that the present invention has been described in its preferred embodiments and can be modified in many different ways without departing from the scope of the invention as defined by the appended claims.

In one example, a seal, typically of a resilient material such as a rubber, could be provided about the lower surface of the housing 19 so as to provide for a margin of tolerance in the coupling of the housing 19 and the ball-receiving element 15.

In another example, one of the lower surface of the ball-receiving element 15 or the upper surface of the substrate 42 can include a spacer for spacing the ball-retaining deposits from the lower surface of the ball-receiving element 15.

The invention claimed is:

1. A filling device for filling balls in an array of apertures in a ball-receiving element, the filling device comprising:
   a housing laterally movable over the ball-receiving element, the housing together with the ball-receiving element defining a chamber for containing a supply of balls and including an opening at a lower surface thereof at which a layer of balls is presented on the ball-receiving element; and
   distribution means disposed within the housing for causing circulation of the balls contained in the chamber over at least a region of the opening in the housing.

2. The filling device of claim 1, wherein the distribution means is configured such as to maintain a limited number of layers of the balls over at least a region of the opening in the housing.

3. The filling device of claim 2, wherein the distribution means is configured to provide substantially a single layer of balls over at least a region of the opening in the housing.

4. A filling device for filling balls in an array of apertures in a ball-receiving element, the filling device comprising:
- a housing including an opening at a lower surface thereof and defining in part a chamber for containing a supply of balls, the housing being in use movably disposed over the ball-receiving element: and
- distribution means disposed within the housing for causing circulation of the balls contained in the chamber over at least a region of the opening in the housing,
- wherein the distribution means comprises a track-defining member having a lower surface operably disposed in spaced relation to the lower surface of the housing such as to define a track of restricted height therebeneath when disposed over the ball-receiving element.

5. The filling device of claim 4, wherein the lower surface of the track-defining member is substantially planar.

6. The filling device of claim 4, wherein at least the lower surface of the track-defining member is formed of a resilient material.

7. The filling device of claim 4, wherein the track-defining member is spaced relative to the lower surface of the housing such as to define a track for a single layer of balls therebeneath.

8. The filling device of claim 7, wherein the track-defining member is spaced relative to the lower surface of the housing such as to define a channel having a height substantially equal to the diameter of the balls.

9. The filling device of claim 7, wherein at least the lower surface of the track-defining member is formed of a resilient material and the lower surface of the track-defining member is spaced relative to the lower surface of the housing such as to define a channel having a height less than the diameter of the balls, whereby balls are biased downwardly when located beneath the track-defining member.

10. The filling device of claim 4, wherein the track-defining member is movably disposed relative to the housing, and further comprising:
- a loading element for biasing the track-defining member downwardly relative to the lower surface of the housing.

11. The filling device of claim 10, wherein the biasing force of the loading element is such as to maintain a single layer of balls therebeneath.

12. The filling device of claim 1, further comprising: a reservoir for containing a supply of balls; and
- at least one channel connecting the reservoir to the chamber.

13. The filling device of claim 12, wherein the distribution means comprises a track-defining member having a lower surface operably disposed in spaced relation to the lower surface of the housing such as to define a track of restricted height therebeneath when disposed over the ball-receiving element, and comprising at least one channel adjacent a forward edge of the track-defining member in a direction of movement.

14. The filling device of claim 13, comprising at least one channel adjacent each of forward and rearward edges of the track-defining member in a direction of movement.

15. The filling device of claim 1, further comprising:
- a reservoir for containing a supply of balls; and
- a plurality of channels connecting the reservoir to the chamber.

16. A filling device for filling balls in an array of apertures in a ball-receiving element, the filling device comprising:
- a housing including an opening at a lower surface thereof and defining in part a chamber for containing a supply of balls, the housing being in use movably disposed over the ball-receiving element: and
- distribution means disposed within the housing for causing circulation of the balls contained in the chamber over at least a region of the opening in the housing,
- wherein the distribution means comprises first and second downwardly-extending members which define an enclosed space therebeneath, the downwardly-extending members being configured to allow only a limited number of layers of balls to pass therebeneath.

17. The filling device of claim 16, wherein the first and second downwardly-extending members are laterally spaced.

18. The filling device of claim 16, wherein the first and second downwardly-extending members are downwardly and outwardly flared.

19. The filling device of claim 16, wherein the downwardly-extending members are formed of a resilient material.

20. A filling device for filling balls in an array of apertures in a ball-receiving element, the filling device comprising:
- a housing including an opening at a lower surface thereof and defining in part a chamber for containing a supply of balls, the housing being in use movably disposed over the ball-receiving element: and
- distribution means disposed within the housing for causing circulation of the balls contained in the chamber over at least a region of the opening in the housing,
- wherein the distribution means comprises at least one projection extending inwardly of the housing and including a surface having a forward and downward component in a direction of movement.

21. The filling device of claim 20, wherein the at least one surface is a substantially planar surface.

22. The filling device of claim 20, wherein the at least one surface is a curved surface.

23. The filling device of claim 20, wherein the distribution means comprises first and second projections, each extending inwardly and including a surface having a forward and downward component in the respective directions of movement.

24. A filling device for filling balls in an array of apertures in a ball-receiving element, the filling device comprising:
- a housing including an opening at a lower surface thereof and defining in part a chamber for containing a supply of balls, the housing being in use movably disposed over the ball-receiving element: and
- distribution means disposed within the housing for causing circulation of the balls contained in the chamber over at least a region of the opening in the housing,
- wherein the housing includes a wiper disposed internally along one, rearward edge thereof in a direction of movement.

25. The filling device of claim 24, wherein the housing includes wipers disposed internally along each of the edges thereof in the respective directions of movement.

26. The filling device of claim 1, wherein the balls comprise solder balls.

27. The filling device of claim 12, wherein the lower end of the at least one channel is spaced from the lower surface of the housing such as to restrict the fill level of balls in the chamber.

28. The filling device of claim 1, wherein the distribution means comprises at least one channel through which balls are in use supplied to the chamber, the lower end of the at least one channel being spaced from the lower surface of the housing such as to restrict the fill level of balls at at least a region of the opening in the housing.

29. The filling device of claim 28, comprising a plurality of channels.

* * * * *